US012296393B2

(12) United States Patent
Liu (10) Patent No.: US 12,296,393 B2
(45) Date of Patent: May 13, 2025

(54) ALUMINUM OXYNITRIDE COATINGS WITH ENHANCED CRYSTALLINITY

(71) Applicant: KENNAMETAL INC., Latrobe, PA (US)

(72) Inventor: Zhenyu Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 85 days.

(21) Appl. No.: 18/143,276

(22) Filed: May 4, 2023

(65) Prior Publication Data

US 2024/0367237 A1 Nov. 7, 2024

(51) Int. Cl.
*C23C 28/04* (2006.01)
*B23B 27/14* (2006.01)
*C23C 16/30* (2006.01)
*C23C 16/36* (2006.01)
*C23C 16/40* (2006.01)

(52) U.S. Cl.
CPC .......... *B23B 27/148* (2013.01); *C23C 16/303* (2013.01); *C23C 16/308* (2013.01); *C23C 16/36* (2013.01); *C23C 16/403* (2013.01); *C23C 28/044* (2013.01); *B23B 2224/04* (2013.01); *B23B 2224/08* (2013.01); *B23B 2224/32* (2013.01); *B23B 2224/36* (2013.01); *B23B 2228/105* (2013.01)

(58) Field of Classification Search
None
See application file for complete search history.

(56) References Cited

U.S. PATENT DOCUMENTS

| 4,818,635 | A | 4/1989 | Ekstrom et al. |
| 5,053,363 | A | 10/1991 | Brandt |
| 5,194,073 | A | 3/1993 | Winter et al. |
| 5,921,725 | A | 7/1999 | Kashiwagi et al. |
| 2007/0042222 | A1 | 2/2007 | Lengauer et al. |
| 2008/0240876 | A1 | 10/2008 | Elkouby et al. |
| 2012/0237794 | A1* | 9/2012 | Sottke .................... C22C 29/16 501/153 |
| 2014/0208659 | A1 | 7/2014 | Sottke et al. |
| 2014/0208662 | A1* | 7/2014 | Wendt ..................... B24D 3/06 51/309 |
| 2015/0064431 | A1 | 3/2015 | Sottke et al. |

FOREIGN PATENT DOCUMENTS

| CN | 114686883 A | 7/2022 | |
| EP | 1316627 A1 * | 6/2003 | ......... C23C 14/0676 |
| JP | S60127905 A | 7/1985 | |
| JP | H07136810 A | 5/1995 | |
| JP | 2008207286 A | 9/2008 | |
| KR | 20150087065 A | 7/2015 | |

* cited by examiner

Primary Examiner — Kim S. Horger
(74) Attorney, Agent, or Firm — Christopher J. Owens (57) ABSTRACT

In one aspect, a coated cutting tool described herein comprises a substrate and a coating adhered to the substrate, the coating including a refractory layer comprising AlON, the AlON layer exhibiting a peak in a range of 33-35° 2θ in an XRD, wherein the peak has a FWHM of 0.1°-0.7° 2θ. In some embodiments, the AlON layer can exhibit a ribbon-like crystallites, needle-like crystallites, or rice-like crystallites and associated surface texture.

13 Claims, 8 Drawing Sheets

Inventive Example 1

Inventive Example 1

ALUMINUM OXYNITRIDE COATINGS WITH ENHANCED CRYSTALLINITY

FIELD

The present invention relates to aluminum oxynitride (AlON) coatings deposited by chemical vapor deposition and, in particular, to AlON coatings exhibiting enhanced crystallinity.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, cutting tools are described herein having coatings adhered thereto which, in some embodiments, can demonstrate desirable metal cutting performance, including increased cutting lifetimes. Briefly, a coated cutting tool described herein comprises a substrate and a coating adhered to the substrate, the coating including a refractory layer comprising aluminum oxynitride (AlON), the AlON layer exhibiting a peak in a range of 33°-35° 2θ in an X-ray diffractogram (XRD), wherein the peak has a full width half maximum (FWHM) of 0.1°-0.7° 2θ. In some embodiments, the FWHM of the AlON peak is 0.15°-0.6° 2θ. Moreover, the AlON layer, in some embodiments, can exhibit crystallites or grains having ribbon-like, needle-like, or rice-like morphology. The coating adhered to the cutting tool substrate, in some embodiments, further comprises one or more inner layers between the AlON layer and the substrate and/or one or more outer layers deposited over the AlON layer.

These and other embodiments are described further in the detailed description which follows.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, a coated cutting tool described herein comprises a substrate and a coating adhered to the substrate, the coating including a refractory layer comprising AlON, the AlON layer exhibiting a peak in a range of 33-35° 2θ in an XRD, wherein the peak has a FWHM of 0.1°-0.7° 2θ. In some embodiments, the AlON layer can exhibit crystallites or grains having ribbon-like, needle-like, or rice-like morphology. The coating adhered to the cutting tool substrate, in some embodiments, further comprises one or more inner layers between the refractory layer and the substrate and/or one or more outer layers deposited over the refractory layer.

Turning now to specific components, coated cutting tools described herein comprise a substrate. A coated cutting tool can comprise any substrate not inconsistent with the objectives of the present invention. A substrate, in some embodiments, is an end mill, drill or indexable cutting insert. Indexable cutting inserts can have any desired ANSI standard geometry for milling or turning applications. Substrates of coated cutting tools described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 3 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide cutting tool substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

Inner layers of coatings described herein can have any thickness not inconsistent with the objectives of the present invention. Coating inner layer(s) can have a thickness ranging from 0.5 μm to 15 μm. In some embodiments, thickness of an inner layer is selected according to the position of the inner layer in the coating. An inner layer deposited directly on a surface of the substrate as an initial layer of the coating, for example, can have thickness ranging from 0.5 to 3 μm. An initial layer, in some embodiments can be TiN or TiCN. An inner layer deposited over the initial layer, such as a TiCN layer, can have thickness ranging from 2 μm to 12 μm.

Figure 1A:
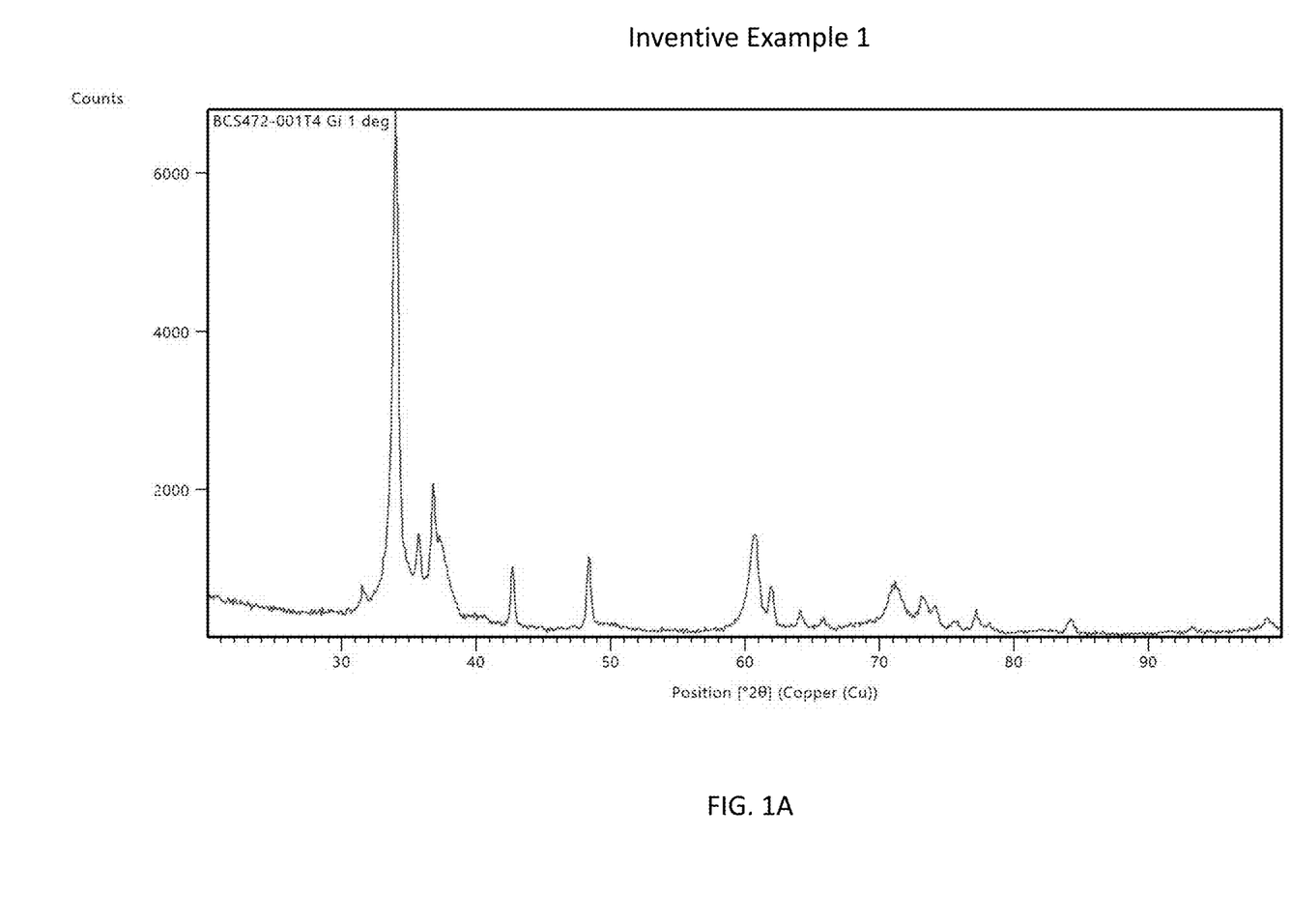
FIGS. 1A-1C are X-ray diffractograms of AlON layers described herein, according to some embodiments.
Figure 1B:
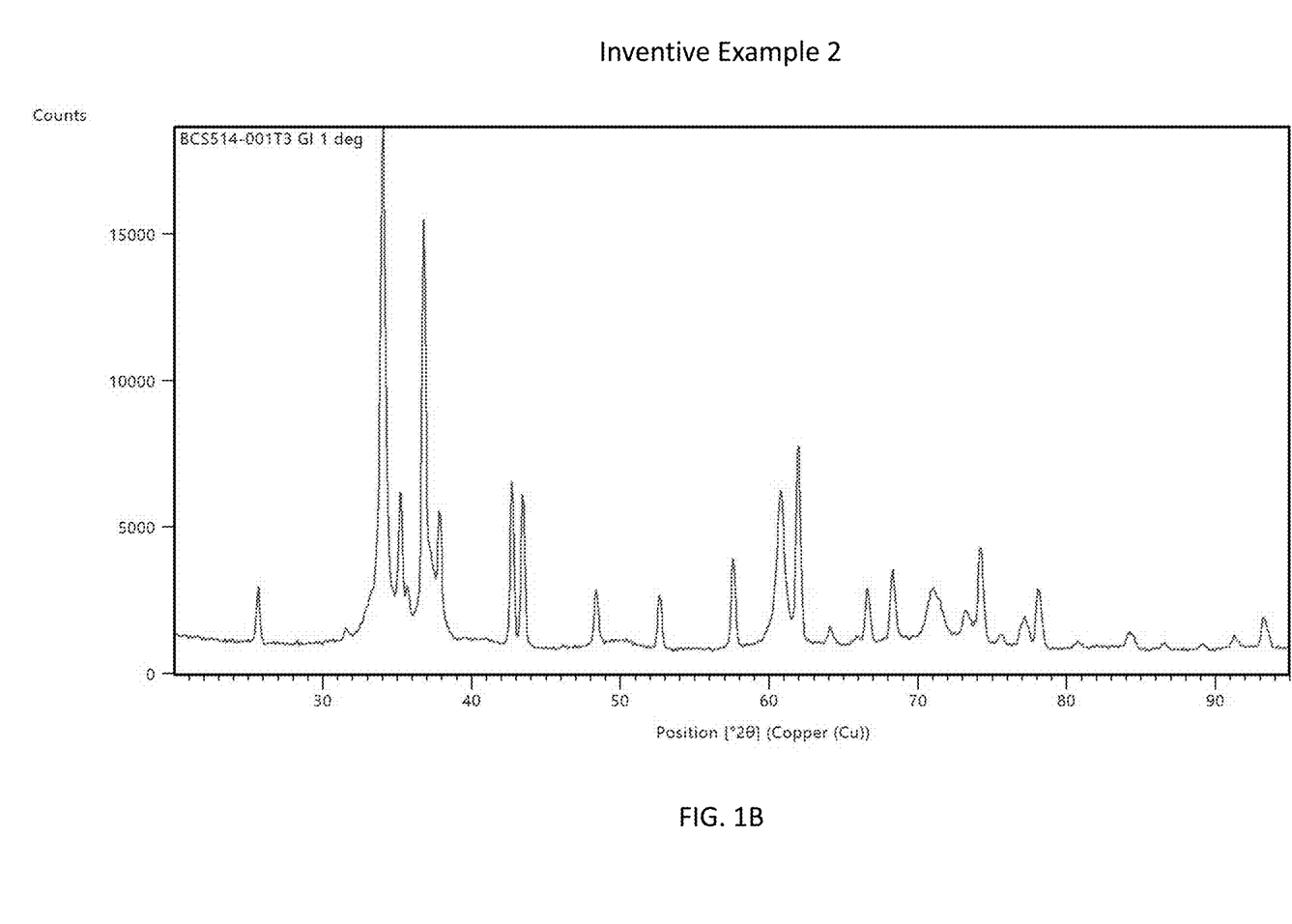
Figure 1C:
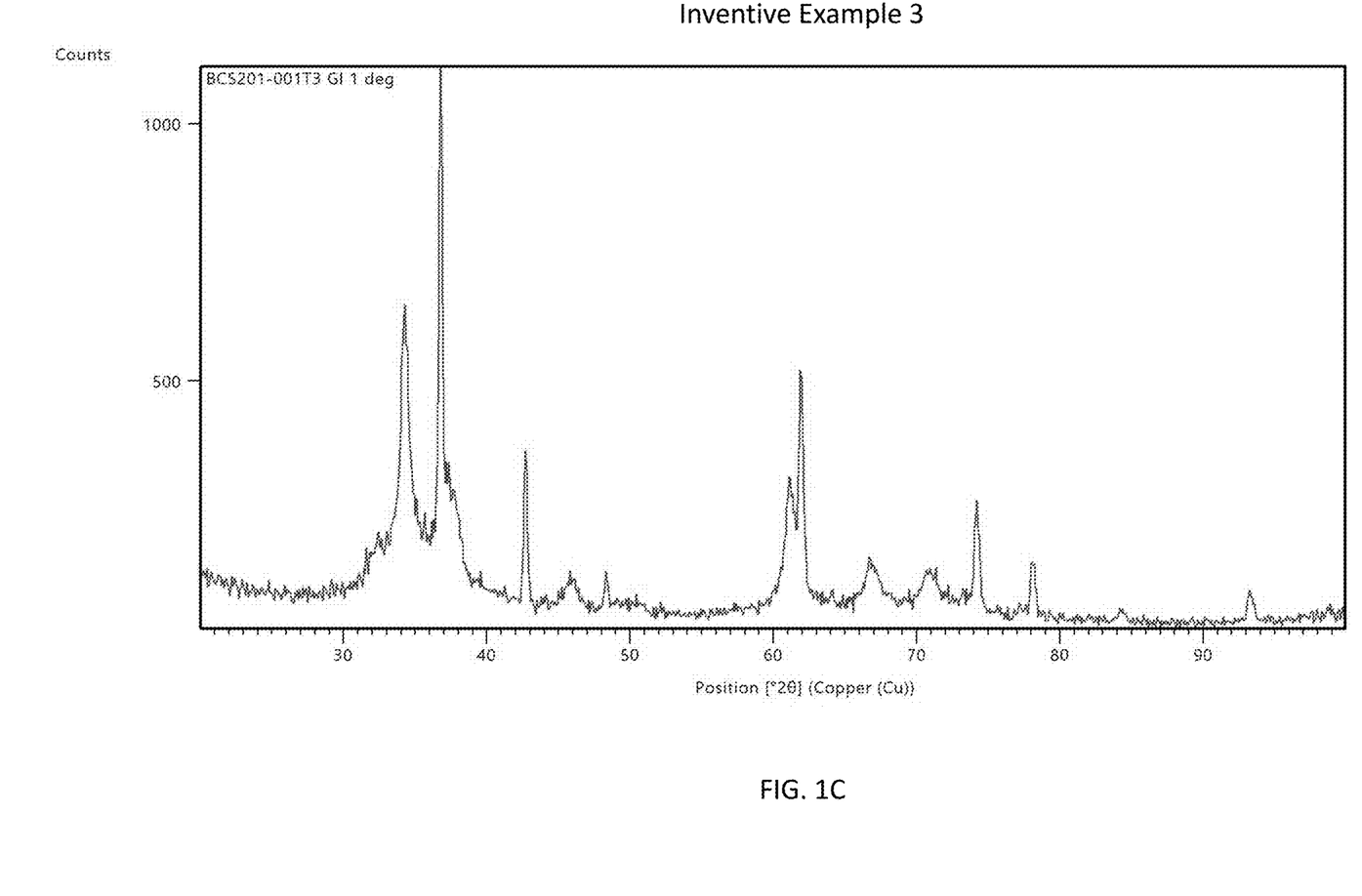
Figure 1D:
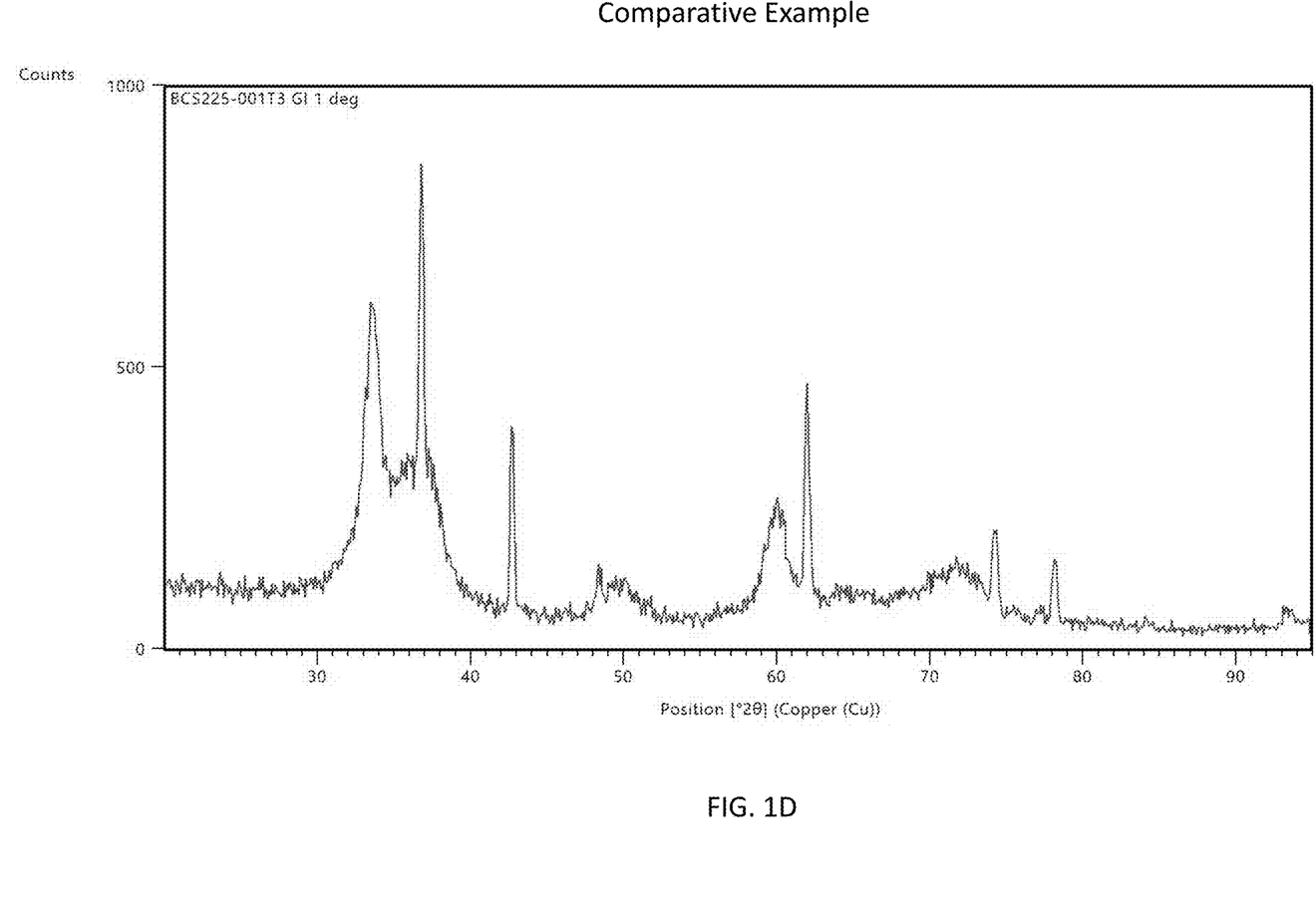
FIG. 1D is an X-ray diffractogram of a comparative AlON layer.
Figure 2A:
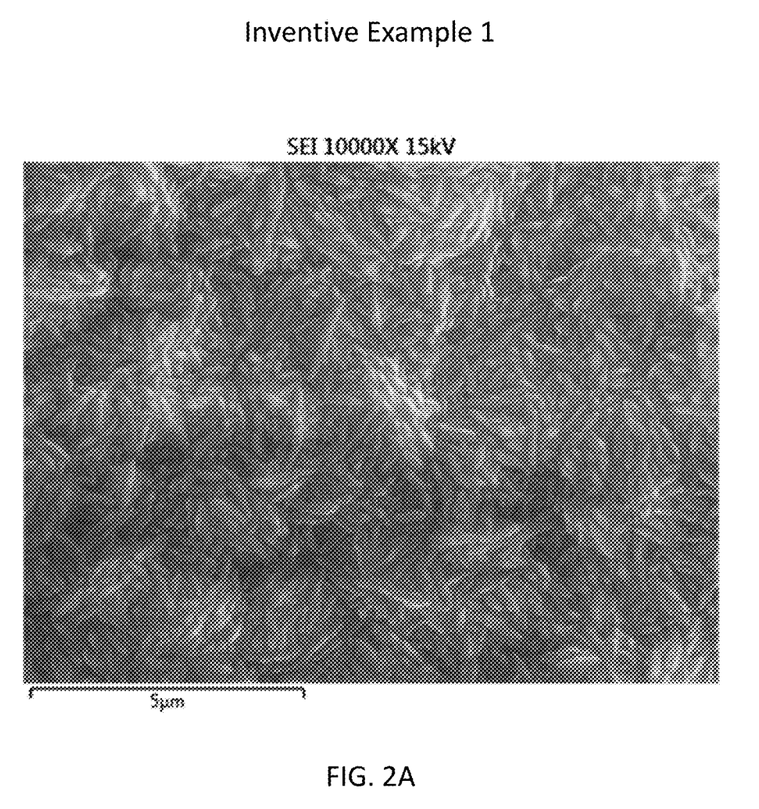
FIGS. 2A-2C are scanning electron microscopy (SEM) images of AlON layers described herein, according to some embodiments.
Figure 2B:
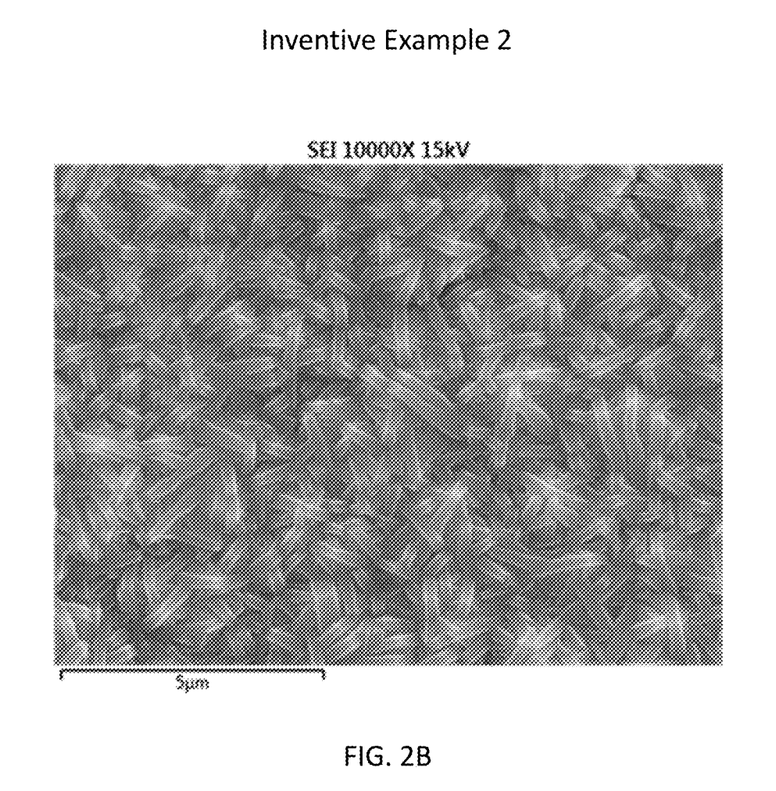
Figure 2C:
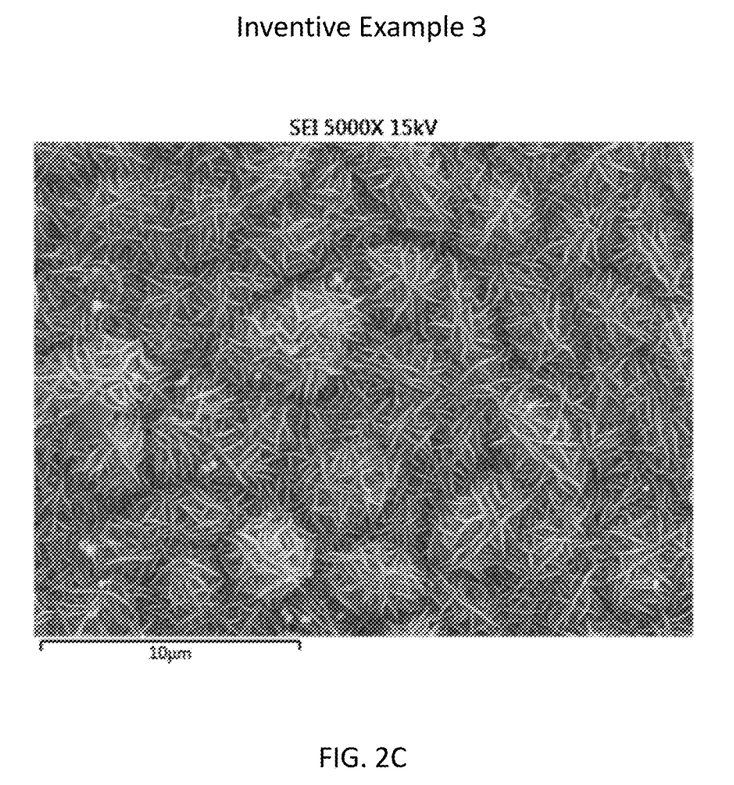
Figure 2D:
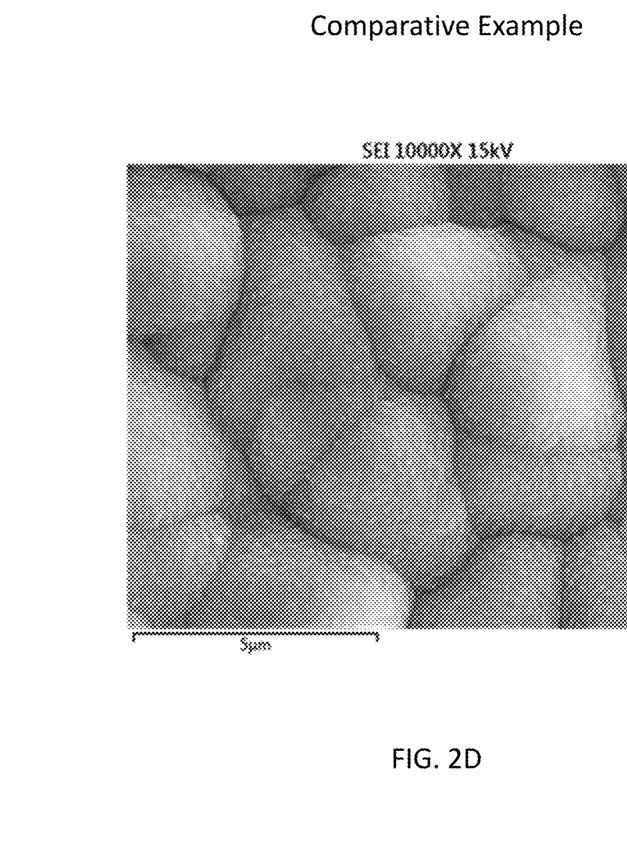
FIG. 2D is an SEM image of a comparative AlON layer.

As described herein, the refractory layer comprising AlON exhibits a peak in a range of 33°-35° 2θ in an XRD, wherein the peak has a FWHM of 0.1°-0.7° 2θ. The FWHM can vary with the level of crystallinity in the AlON layer, as well with AlON crystallite size and morphology. In some embodiments, the FWHM of the AlON peak is 0.15°-0.65° 2θ or 0.2°-0.6° 2θ. The diffractograms of FIGS. 1A-1C illustrate the variances in FWHM of the AlON peak, according to some embodiments herein. Additionally, as detailed further in the examples hereinbelow, the AlON grain or crystallite morphologies differ with the differing FWHM values. As illustrated in the SEM images of FIGS. 2A-2C, the grain or crystallites of the AlON layer can exhibit ribbon-like, rice-like, or needle-like morphologies. These grain morphologies are in stark contrast to the prior comparative AlON layer of FIG. 2D. In some embodiments, aspect ratio (length/width) of the ribbon-like, rice-like or needle-like AlON grains or crystallites is at least 2. Aspect ratio of the ribbon-like, rice-like, or needle-like AlON grains or crystallites can also have a value selected from Table I.

TABLE I

| AlON Grain Aspect Ratio |
| --- |
| 2-30 |
| 4-30 |
| 5-30 |
| 4-20 |
| 5-15 |

In some embodiments, the AlON layer can exhibit ribbon-like, rice-like or needle-like AlON grains or crystallites wherein the XRD parameters of peak position and FWHM are not met. Additionally, the grains or crystallites can present a ribbon-like, rice-like or needle-like surface texture of the AlON layer.

For the purposes of determining peak positioning and peak FWHM of the AlON layer, the following XRD protocol was employed. XRD data were collected using a Panalytical XRD instrument with Cu radiation 1.5406 Å and long fine focus X-ray tube operating at 45 KV and 40 mA at grazing incidence of 1-5 degrees to collect spectra from AlON layers described herein.

Baseline was determined by using HighScorePlus (Degen et al, *Powder Diffraction*, "The Hghscore Suite" Volume 29, Supplement S2, December 2014, pp S13-S18) using automatic mode (Sonneveld and Visser, "Automatic collection of powder data from photographs", *J. Appl. Cryst.* (1975), 81, 1975) to smoothly fit broad features near the corresponding peak at 2θ°. Fit of the baseline in 2θ was outside the range (2θ°−2×FWHM), (2θ°+2×FWHM). The baseline may include scattering from non-crystalline phases, nanocrystalline phase, unresolved closely located hkl reflections from coating or other phases, as well as generally observed background such as fluorescence, Compton scattering etc.

Two factors were adjusted to draw smooth background, namely bending factor and granularity, and these are (Degen et al, 2014):
1. Bending factor: The curvature of the background.
2. Granularity: The number of intervals is adjusted for the background determination.

The corresponding peak is defined as the part above thus determined baseline. Therefore, the peak height is defined as the different from the peak intensity (counts) minus the baseline intensity (counts). The FWHM was determined by a curve fitting using a pseudo-Voigt line-shape.

The AlON layer, in some embodiments, exhibits a nitrogen to oxygen ratio (N/O) of 1 or less. The N/O ratio of the AlON layer can have a value selected from Table II, in some embodiments.

TABLE II

| N/O Ratio of AlON Layer |
| --- |
| 0.2-0.9 |
| 0.25-0.8 |
| 0.3-0.7 |
| 0.2-0.75 |

N/O ratio of the AlON layer is determined by x-ray energy dispersive spectrum (EDS) associated with scanning electron microscopy (SEM).

In addition to the foregoing compositional properties, AlON layers described herein can exhibit desirable mechanical properties. In some embodiments, the AlON layer has a nanohardness of at least 20 GPa. In some embodiments, the AlON layer has nanohardness of 20 GPa to 30 GPa. AlON nanohardness can be in the as-deposited state. Alternatively, the nanohardness can reflect a blasted or polished condition of the AlON layer. Nanohardness values recited herein were determined from nano-indentation testing conducted with a Fischerscope HM2000 in accordance with ISO standard 14577 using a Vickers indenter. Indentation depth was set to 0.2 µm. AlON layers described herein can also have a Young's modulus of at least 300 MPa. In some embodiments, Young's modulus of an AlON layer is 200-800 MPa or 300-600 MPa.

In addition to hardness, AlON layers described herein can exhibit a nanohardness to Young's modulus ratio (H/E) of 0.03 to 0.08. In some embodiments, the H/E ratio ranges from 0.04 to 0.07. AlON layers described herein can have any desired thickness. Thickness of an AlON layer can be determined according to several considerations including, but not limited to, specific application of the cutting tool and/or overall coating architecture. In some embodiments, an AlON layer described herein has a thickness of 1 µm to 15 µm or 2 µm to 10 µm.

In some embodiments, a refractory layer described herein is the outermost layer of the coating. Alternatively, a coating described herein can comprise one or more outer layers over the refractory layer. Outer layer(s) can comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.5 µm to 5 µm.

As described herein, the AlON layer exhibiting the foregoing features is deposited by CVD. Table III provided AlON layer deposition conditions.

TABLE III

| AlON CVD Deposition Conditions | |
|---|---|
| Temperature (° C.) | 800° C.-1050° C. |
| Pressure (mbar) | 40-500 |
| Time (min) | 60-600 |
| $H_2$ (l/min) | 10-300 |
| $AlCl_3$ (l/min) | 1-5 |
| $NH_3$ (l/min) | 0.05-2 |
| $CO_2$ (l/min) | 0.2-2 |
| HCl (l/min) | 0.1-2 |

Variances in the N/O ratios described herein can be achieved by varying individual amounts of reactant gases in the deposition mixture. As described herein, a plurality of coating inner layers can reside between the cutting tool substrate and AlON layer. General CVD deposition parameters for various inner layers are provided in Table IV.

TABLE IV

| CVD Parameters for Inner layer deposition | | | | |
|---|---|---|---|---|
| Base Layer Composition | Gas Mixture | Temperature (° C.) | Pressure (mbar) | Duration (minutes) |
| TiN | $H_2$, $N_2$, $TiCl_4$ | 800-900 | 60-300 | 20-60 |
| TiCN(MT) | $H_2$, $N_2$, $TiCl_4$, $CH_3CN$ | 750-900 | 30-120 | 60-300 |
| TiCN(HT) | $H_2$, $N_2$, $TiCl_4$, $CH_4$ | 900-1050 | 30-300 | 30-100 |
| TiOCN | $H_2$, $N_2$, $TiCl_4$, $CH_4$, CO | 900-1050 | 60-500 | 30-100 |
| $Al_2O_3$ | $H_2$, $AlCl_3$, $CO_2$, $H_2S$*, HCl | 900-1000 | 40-150 | 60-300 |

*Optional

These and other embodiments are further illustrated in the following non-limiting examples.

Example 1—Coated Cutting Tools

Coated cutting tools having compositions and properties described herein were produced by placing cemented carbide (WC-Co) cutting insert substrates [ANSI standard geometry SNMA/CNMA432] into a hot filament heated CVD reactor. The cutting inserts comprised 6-12 wt. % cobalt binder with the balance WC grains of size 3-6 µm. The CVD coatings employed a TiN base layer and refractory outer layer of AlON. The TiN base layer was deposited according to the parameters of Table IV. The refractory AlON layer was deposited according to Table V.

TABLE V

| AlON Deposition Conditions | | | | |
|---|---|---|---|---|
| Parameter | Inventive 1 | Inventive 2 | Inventive 3 | Comparative |
| Temperature (° C.) | 900 | 920 | 950 | 850 |
| Pressure (mbar) | 90 | 90 | 90 | 90 |
| Time (min) | 360 | 360 | 360 | 360 |
| $H_2$ (l/min) | 20 | 20 | 20 | 20 |
| $AlCl_3$ (l/min) | 1.2 | 1.2 | 1.2 | 1.2 |
| $NH_3$ (l/min) | 0.3 | 0.3 | 0.1 | 0.5 |
| $CO_2$ (l/min) | 0.5 | 0.5 | 0.5 | 0.5 |
| HCl (l/min) | 1.2 | 1.2 | 1.5 | 1.2 |

The deposited AlON layers exhibited the following properties provided in Tables VI and VII.

TABLE VI

| AlON Layer Properties | | | | | |
|---|---|---|---|---|---|
| Example | Thickness | Peak Position °2θ | FWHM °2θ | N/O Ratio | Grain Morphology |
| Inventive 1 | 4.5 | 33.99 | 0.37 | 1.0 | Rice-like |
| Inventive 2 | 5.2 | 34.26 | 0.58 | 0.7 | Ribbon-like |
| Inventive 3 | 4.8 | 33.96 | 0.20 | 0.3 | Needle-like |
| Comparative | 4.5 | 33.56 | 0.92 | 1.2 | Globular |

TABLE VII

| AlON Layer Properties | | | |
|---|---|---|---|
| Example | Nanohardness (GPa) | Modulus | Hardness/Modulus |
| Inventive 1 | 24.17 ± 1.66 | 540.01 ± 25 | 0.04 |
| Inventive 2 | 23.32 ± 0.90 | 313.35 ± 5.0 | 0.07 |
| Inventive 3 | 24.73 ± 1.66 | 402.16 ± 38.6 | 0.06 |
| Comparative | 20.93 ± 0.90 | 241.73 ± 5 | 0.09 |

FIGS. 1A-1D provide XRD spectra of the Inventive and Comparative examples. FIGS. 2A-2D are SEM images illustrating the differences in grain or crystallite morphologies between the Inventive and Comparative examples.

Example 2—Milling Testing

Cutting inserts of the Inventive and Comparative samples were subjected to milling testing according to the parameters set forth below.
Milling Parameters
　Workpiece—GGG60
　Cutting Speed—200 m/min
　fz—0.2 mm/rev
　ap—2 mm
　Coolant—flood
The results of the milling testing are provided in Table VIII.

TABLE VIII

| Milling Testing Results | | |
|---|---|---|
| Example | Insert life (min) | Improvement (%) |
| Comparative | 9.5 | 0 |
| Inventive 1 | 10.8 | 14 |
| Inventive 2 | 15.5 | 63 |

As provided in Table VIII, the Inventive examples employing AlON layers having composition and properties described herein exhibited superior cutting performance relative to the prior Comparative AlON layer.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:
1. A coated cutting tool comprising:
a substrate; and
a coating adhered to the substrate, the coating including a refractory layer comprising aluminum oxynitride (AlON), the AlON layer exhibiting a peak in a range of 33°-35° 2θ in an X-ray diffractogram (XRD), wherein the peak has a full width half maximum (FWHM) of 0.1°-0.7° 2θ, and wherein the AlON layer has a nitrogen to oxygen ratio (N/O) of 1 or less.

2. The coated cutting tool of claim 1, wherein the FWHM of the AlON peak is 0.15°-0.6° 2θ.

3. The coated cutting tool of claim 1, wherein grains of the AlON layer have an aspect ratio of 5-30.

4. The coated cutting tool of claim 1, wherein the N/O ratio is 0.2-0.9.

5. The coated cutting tool of claim 1, wherein the AlON layer has a nanohardness of at least 20 GPa.

6. The coated cutting tool of claim 5, wherein the nanohardness is 20-30 GPa.

7. The coated cutting tool of claim 1, wherein the AlON layer has a Young's modulus of 200-800 MPa.

8. The coated cutting tool of claim 1 having a hardness to Young's modulus ratio of 0.03-0.08.

9. The coated cutting tool of claim 1, wherein the AlON layer has a thickness of 1-15 μm.

10. The coated cutting tool of claim 1 further comprising one or more inner layers between the refractory layer and the substrate.

11. The coated cutting tool of claim 10, wherein an inner layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

12. The coated cutting tool of claim 11, wherein the one or more inner layers are selected from the group consisting of TiN, TiCN, TiOCN, and alumina.

13. The coated cutting tool of claim 1, wherein the substrate is cemented carbide or cermet.

* * * * *